(12) United States Patent
Hooker et al.

(10) Patent No.: US 8,766,370 B2
(45) Date of Patent: Jul. 1, 2014

(54) SINGLE METAL DUAL DIELECTRIC CMOS DEVICE

(75) Inventors: Jacob Christopher Hooker, Hamburg (DE); Raghunath Singanamalla, Mumbai (IN); Jasmine Petry, Evere (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 563 days.

(21) Appl. No.: 12/645,905

(22) Filed: Dec. 23, 2009

(65) Prior Publication Data

US 2011/0095376 A1  Apr. 28, 2011

Related U.S. Application Data

(60) Provisional application No. 61/254,003, filed on Oct. 22, 2009.

(51) Int. Cl.
*H01L 21/70* (2006.01)

(52) U.S. Cl.
USPC .................. 257/369; 257/E27.062; 438/591

(58) Field of Classification Search
USPC ........................ 257/369, E27.062; 438/591
See application file for complete search history.

(56) References Cited

U.S. PATENT DOCUMENTS

| | | | |
|---|---|---|---|
| 2002/0149081 A1* | 10/2002 | Goda et al. | 257/510 |
| 2008/0191286 A1* | 8/2008 | Chang et al. | 257/369 |
| 2010/0052074 A1* | 3/2010 | Lin et al. | 257/407 |

* cited by examiner

*Primary Examiner* — Matthew Reames
(74) *Attorney, Agent, or Firm* — Haynes and Boone, LLP

(57) ABSTRACT

The present disclosure provides a semiconductor device that includes a semiconductor substrate having a first region and a second region, a pMOS transistor formed over the first region and an nMOS formed over the second region. The pMOS transistor has a gate structure that includes: an interfacial layer formed over the substrate; a $AlO_x$ layer formed over the interfacial layer; and a metal layer including Mo or W formed over the $AlO_x$ layer. The nMOS transistor has a gate structure that includes: the interfacial layer formed over the substrate; a $DyO_x$ layer formed over the interfacial layer; and the metal layer including Mo or W formed over the $DyO_x$ layer.

20 Claims, 14 Drawing Sheets

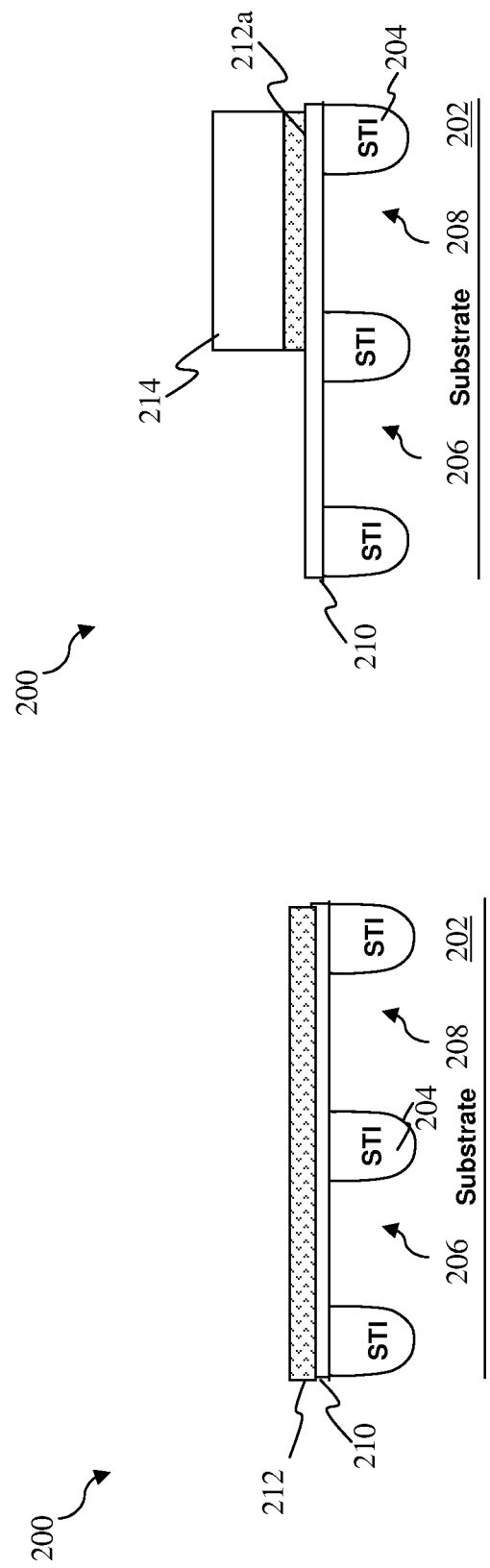

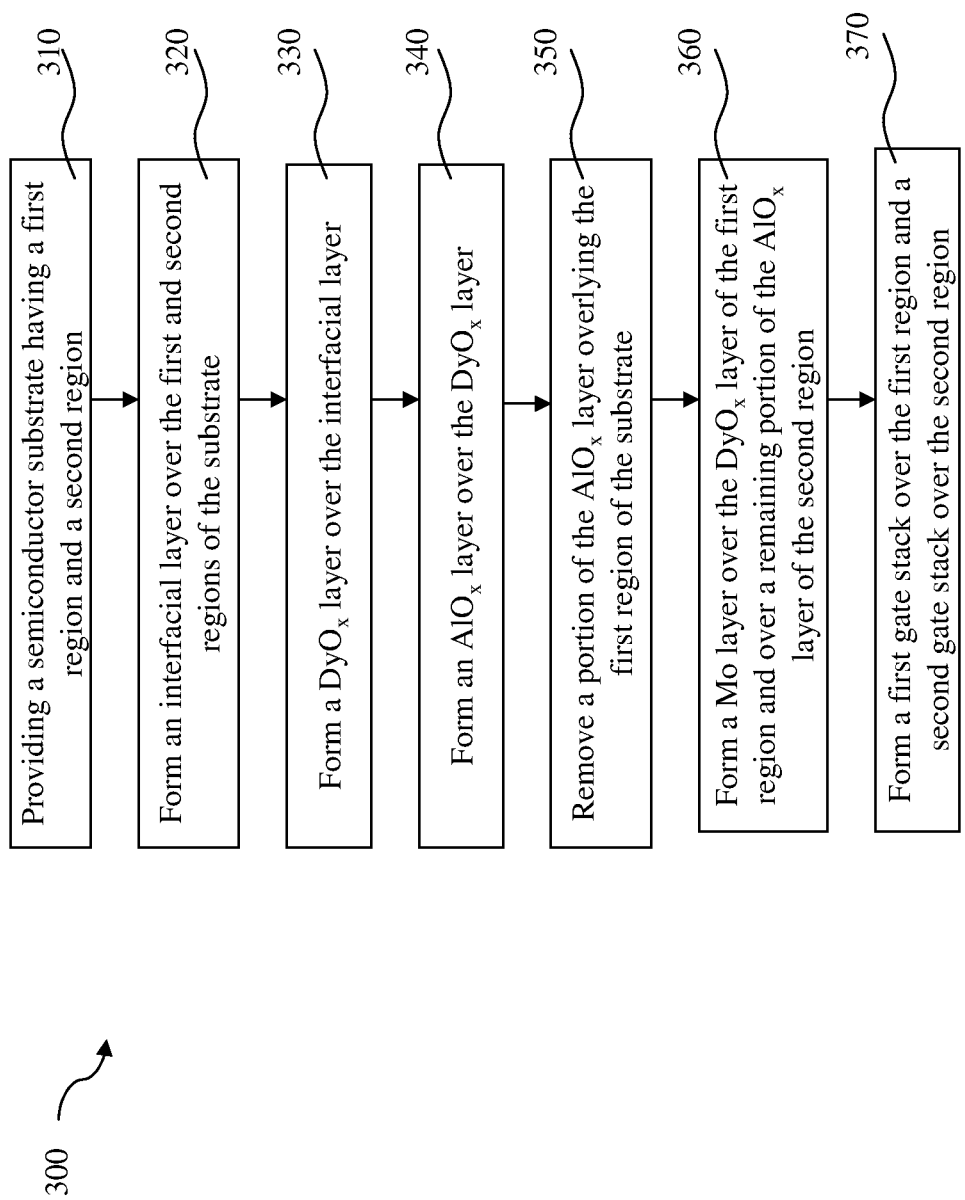

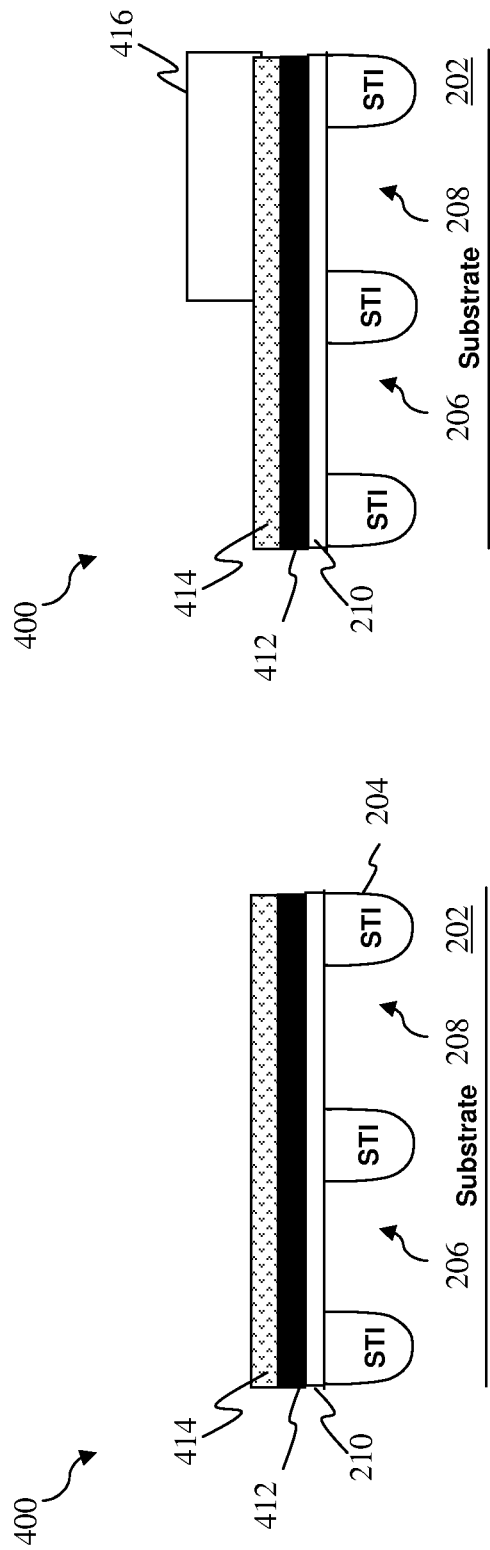

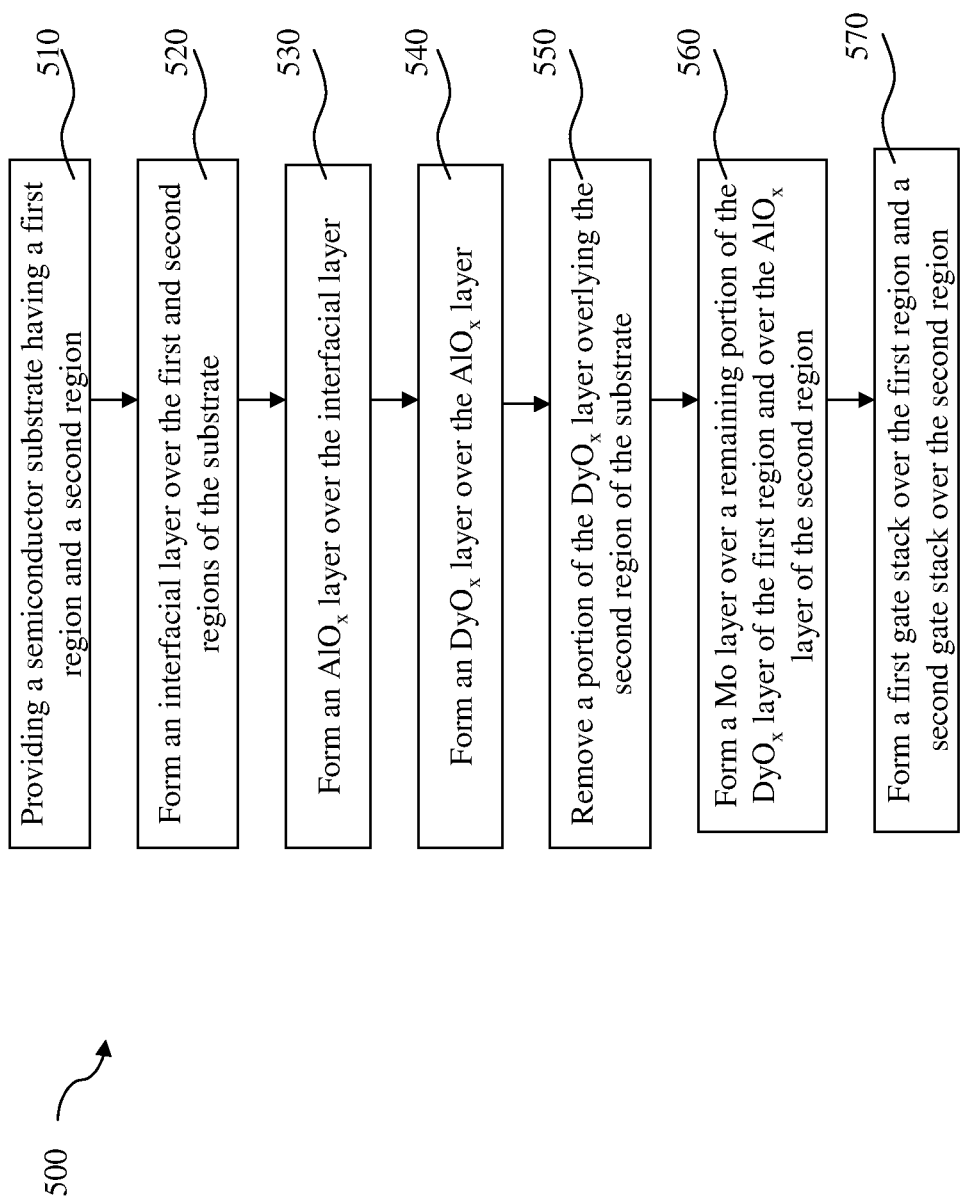

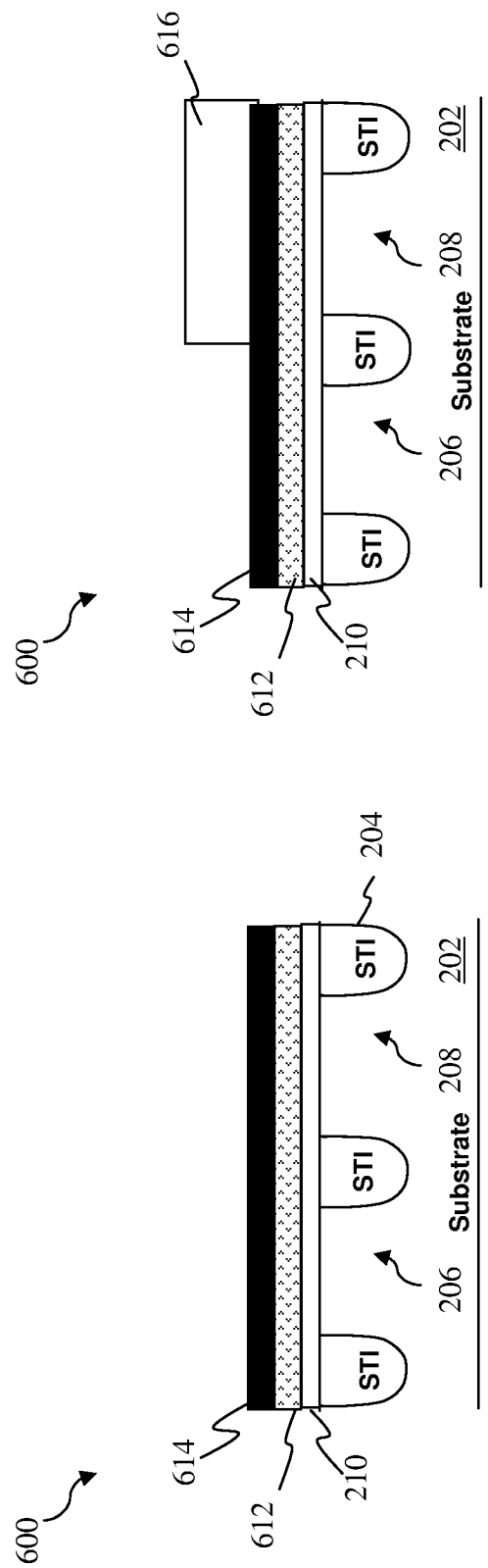

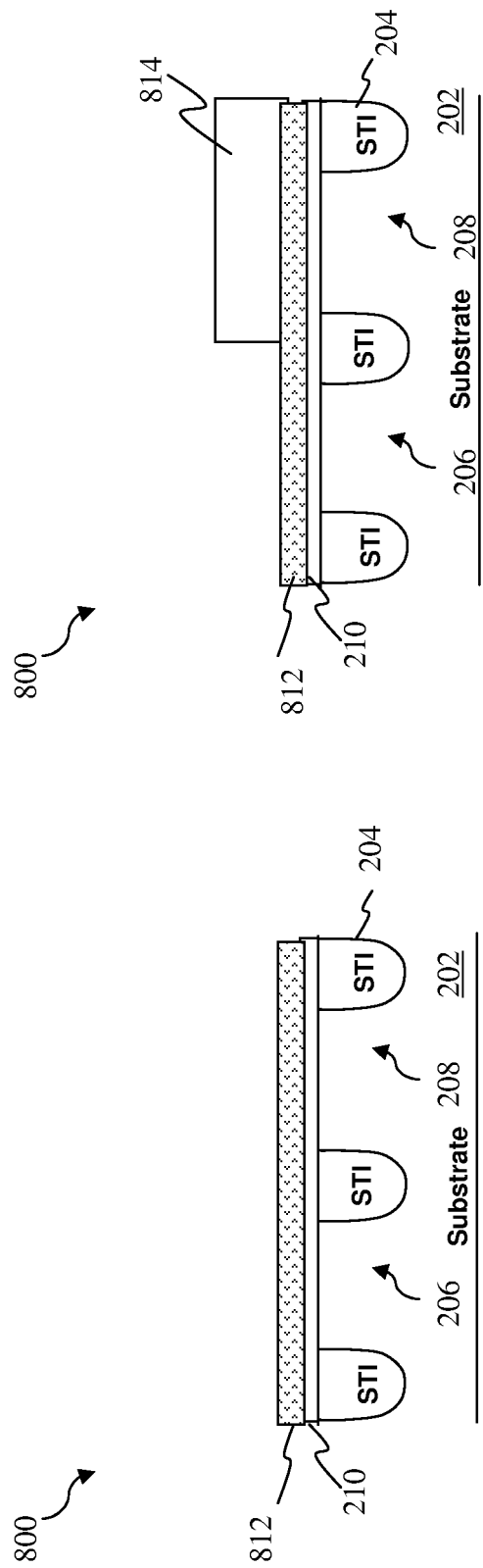

SINGLE METAL DUAL DIELECTRIC CMOS DEVICE

PRIORITY DATA

This application claims the benefit of U.S. Provisional Application Ser. No. 61/254,003 filed on Oct. 22, 2009, entitled "SINGLE METAL DUAL DIELECTRIC CMOS DEVICE," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. However, an n-type MOS device (NMOS) and a p-type MOS device (PMOS) require different work functions for their respective gate electrode.

SUMMARY

One of the broader forms of an embodiment of the present invention involves a semiconductor device. The semiconductor device includes a semiconductor substrate having a first region and a second region; an pMOS transistor formed over the first region, the nMOS transistor having a gate structure that includes: an interfacial layer formed over the substrate; An aluminum oxide ($AlO_x$) layer formed over the interfacial layer; and a metal layer including one of Mo and W formed over the $AlO_x$ layer; a nMOS transistor formed over the second region, the nMOS transistor having a gate structure that includes: the interfacial layer formed over the substrate; a rare earth element oxide (e.g., dysprosium oxide ($DyO_x$)) layer formed over the interfacial layer; and the metal layer including the one of Mo and W formed over the rare earth element oxide layer.

Another one of the broader forms of an embodiment of the present invention involves a method of fabricating a semiconductor device. The method includes providing a semiconductor substrate having a first region and a second region; forming an interfacial layer over the first and second regions of the semiconductor substrate; forming at least a $DyO_x$ layer over the interfacial layer of the first region and at least a $AlO_x$ layer over the interfacial layer of the second region; performing an annealing thereby causing intermixing of the interfacial layer with the $DyO_x$ layer and with the $AlO_x$ layer; forming a Mo layer over the $DyO_x$ layer and over the $AlO_x$ layer; and forming a first gate stack over the first region and a second gate stack over the second region.

Yet another one of the broader forms of an embodiment of the present invention involves a semiconductor device. The semiconductor device includes a semiconductor substrate having a first region and a second region; a pMOS transistor disposed over the first region, the pMOS transistor having a gate structure that includes: an interfacial layer disposed over the substrate, the interfacial layer including one of silicon oxide and silicon oxynitride and having a thickness less than about 2 nm; an $AlO_x$ layer disposed over the interfacial layer, the $AlO_x$ layer having a thickness less than about 3 nm; and a Mo layer disposed over the $AlO_x$ layer, the Mo layer being incorporated with one of O, N, and Si; an nMOS transistor formed over the second region, the nMOS transistor having a gate structure that includes: the interfacial layer disposed over the substrate; a $DyO_x$ layer formed over the interfacial layer, the $DyO_x$ layer having a thickness less than about 3 nm; and the Mo layer disposed over the $DyO_x$ layer.

These embodiments of the present invention allow a single metal (e.g., Mo or W) to be used in dual dielectric CMOS integration without adversely affecting the work functions for the respective gate electrodes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2E are cross-sectional views of a semiconductor device at various stages of fabrication according to the method of FIG. 1;

FIG. 3 is a flow chart illustrating another method of fabricating a semiconductor device in a high-k/metal gate process according to various aspects of the present disclosure;

FIGS. 4A to 4D are cross-sectional views of semiconductor device at various stages of fabrication according to the method of FIG. 3;

FIG. 5 is a flow chart illustrating yet another method of fabricating a semiconductor device in a high-k/metal gate process according to various aspects of the present disclosure;

FIGS. 6A to 6D are cross-sectional views of semiconductor device at various stages of fabrication according to the method of FIG. 5;

FIGS. 8A to 8E are cross-sectional views of semiconductor device at various stages of fabrication according to the method of FIG. 7.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
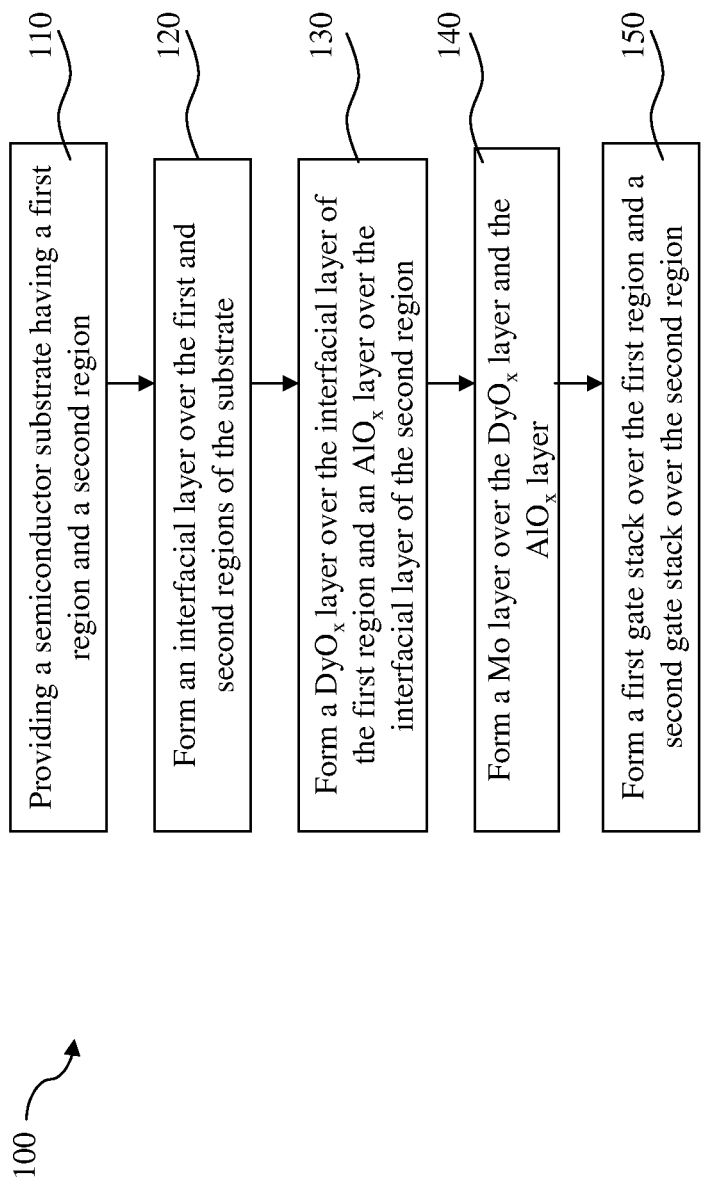
FIG. 1 is a flow chart illustrating a method for fabricating a semiconductor device in a high-k/metal gate process according to various aspects of the present disclosure.

Referring to FIG. 1, illustrated is a flowchart of a method 100 for fabricating a semiconductor device having a dual high-k dielectric and single metal gate according to various aspects of the present disclosure. Referring also to FIGS. 2A to 2E, illustrated are cross-sectional views of a semiconductor device 100 at various stages of fabrication according to the method 100 of FIG. 1. FIGS. 2A to 2E have been simplified to emphasize gate structures of an n-type MOS (nMOS) device and p-type MOS (pMOS) device, respectively, for a better understanding of the inventive concepts of the present embodiment.

The method 100 begins with block 110 in which a semiconductor substrate having a first region and a second region is provided. In FIG. 2A, the semiconductor device 200 includes a semiconductor substrate 202 such as a silicon substrate. The substrate 202 may alternatively include silicon germanium, gallium arsenic, or other suitable semiconductor materials. The substrate 202 may further include other features such as various doped regions such as a p-well, n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an nMOS transistor device and the active region 208 may be configured as a pMOS transistor device.

The method 100 continues with block 120 in which an interfacial layer is formed over the first and second regions of the substrate. The semiconductor device 200 further includes an interfacial layer 210 formed on the substrate 202. The interfacial layer 210 may include a silicon oxide ($SiO_2$) layer having a thickness less than 2 nm. Alternatively, the interfacial layer 210 optionally includes silicon oxynitride (SiON) having a thickness less than 2 nm. The interfacial layer 210 may be formed by atomic layer deposition (ALD), chemical vapor deposition (CVD), physical vapor deposition (PVD or sputtering), or other suitable technique.

The method 100 continues with block 130 in which a rare earth element oxide, for example, dysprosium oxide ($DyO_x$) layer is formed over the interfacial layer of the first region and an aluminum oxide ($AlO_x$) layer is formed over the interfacial layer of the second region. The semiconductor device 200 further includes an $AlO_x$ layer 212 formed over the interfacial layer 210. The $AlO_x$ layer 212 may be formed by ALD, CVD, PVD, or other suitable technique. The $AlO_x$ layer 212 may include a thickness less than 3 nm. In the present embodiment, the $AlO_x$ layer 212 has a thickness of about 2 nm.

In FIG. 2B, a patterned photoresist layer 214 is formed to protect the $AlO_x$ layer 212 overlying the pMOS region 208. For example, the patterned photoresist 214 may be formed by a photolithography process. An exemplary photolithography process may include photoresist coating, soft baking, mask aligning, exposing, post-exposure baking, developing photoresist, and hard baking. The photolithography exposing process may also be implemented by other suitable methods such as maskless photolithography, electron-beam writing, ion-beam writing, and molecular imprinting. Alternatively, a hard mask may optionally be used to protect the $AlO_x$ layer 212 in the pMOS region 208 instead of the photoresist. An etching process, such as a wet etching, is performed to remove the unprotected $AlO_x$ layer 212 overlying the nMOS region 206. After the etching process, a portion of the $AlO_x$ layer 212a remains in the pMOS region 208. The patterned photoresist 214 may be removed by a stripping process or other suitable process. Additionally, an annealing process may be performed to repair damage that may have been caused by the etching process on the $AlO_x$ layer. Further, it is noted that the annealing causes intermixing of the interfacial layer 210 and the $AlO_x$ layer 212a which helps in adjusting a work function for properly performing as a pMOS transistor device. The annealing process may optionally be performed later in the fabrication process as disclosed below.

Figures 2C, 2D:
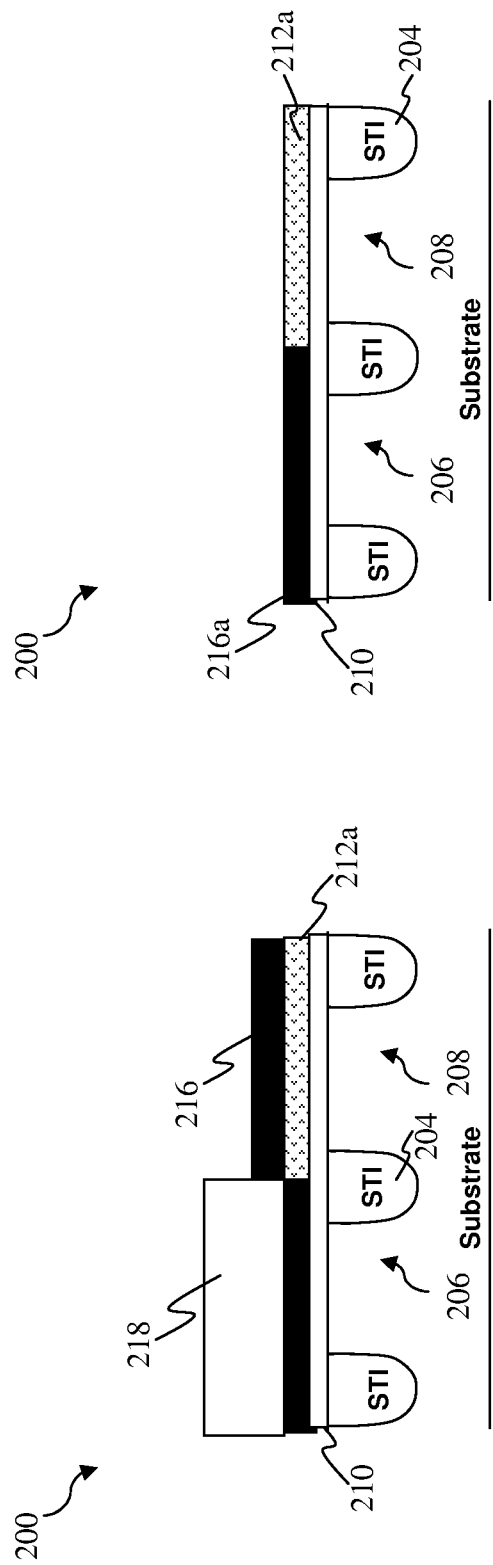

In FIG. 2C, a rare earth oxide, for example, $DyO_x$, $LaO_x$, $YbO_x$, or $ErO_x$ layer 216 is formed over the interfacial layer 210 of the nMOS region 206 and the $AlO_x$ layer 212a of the pMOS region 208. Although rare earth element is preferably dysprosium and $DyO_x$ is used in the following discussion for this and other embodiments, it is noted that other rare earth element oxides may be used. The $DyO_x$ layer 216 may be formed by ALD, CVD, PVD, or other suitable technique. The $DyO_x$ layer 216 may include a thickness less than 3 nm. In the present embodiment, the $DyO_x$ layer 216 has a thickness of about 2 nm. A patterned photoresist layer 218 is formed to protect the $DyO_x$ layer 216 overlying the nMOS region 206.

In FIG. 2D, an etching process, such as a wet etching, is performed to remove the unprotected $DyO_x$ layer 216 overlying the pMOS region 208. After the etching process, a portion of the $DyO_x$ layer 216a remains in the nMOS region 206. The patterned photoresist 218 may be removed by a stripping process or other suitable process. Additionally, an annealing process may optionally be performed to repair damage that may have been caused by the etching process on the $DyO_x$ layer. Further, it is noted that the annealing causes intermixing of the interfacial layer 210 and the $DyO_x$ layer 216a which helps in adjusting a work function for properly performing nMOS transistor device. The annealing may optionally be performed later in the fabrication process as disclosed below.

Figure 2E:
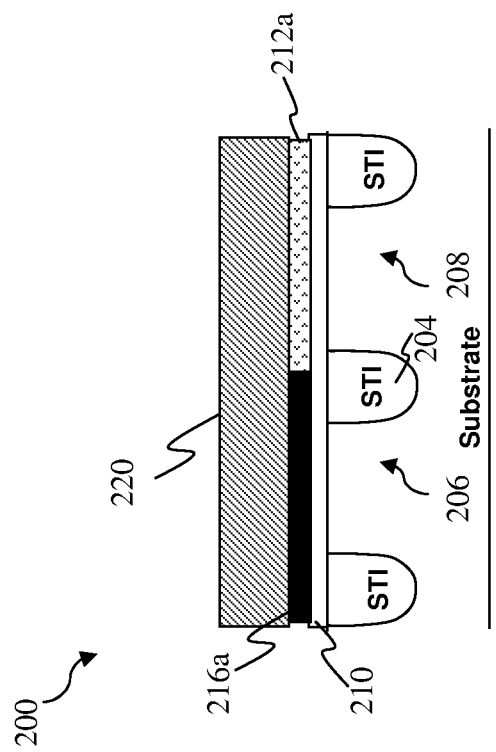

The method 100 continues with block 140 in which a metal (e.g., Mo or W) layer is formed over the $DyO_x$ layer and the $AlO_x$ layer. Although the metal layer is preferably molybdenum (Mo) that is used in the following discussion in this and other embodiments, it is noted that other metal layer such as tungsten (W) may be used. In FIG. 2E, the semiconductor device 200 further includes a Mo layer 220 formed over the $DyO_x$ layer 216a and the $AlO_x$ layer 212a. The Mo layer 220 may have a thickness ranging from 20 to about 200 angstrom (Å). The Mo layer 220 may be formed by various deposition techniques such as CVD, PVD or sputtering, plating, or other suitable technique. In other embodiment, a W layer may be utilized instead of the Mo layer. Further, an annealing process may be performed at this stage to cause some intermixing of the interfacial layer 210 with the $DyO_x$ 216a and with the $AlO_x$ layer 212a to help in adjusting the work function of the respective transistor devices. It has been observed that the interaction of the $DyO_x$ layer and the Mo layer causes a voltage flat band shift towards n-type, and that the shift is larger as the thickness of the $DyO_x$ layer is increased. However, there is a tradeoff with the design requirement for a particular equivalent oxide thickness (EOT) of the gate dielectric.

In some embodiments, the Mo layer 220 may be incorporated with O, N, or Si. For example, it has been observed that various configurations (e.g., composition and thickness) may be used to adjust the work function in the nMOS transistor device. For example, the various configurations include $MoON/DyO_x$ (1 nm)/SiON (1.5 nm), $MoON/DyO_x$ (2 nm)/SiON (1.5 nm), $MoON/DyO_x$ (1 nm)/SiON (2 nm), $MoON/DyO_x$ (2 nm)/SiON (2 nm), $MoO_x/DyO_x$ (1 nm)/SiON (1.5 nm), $MoO_x/DyO_x$ (2 nm)/SiON (1.5 nm), $MoO_x/DyO_x$ (1 nm)/SiON (2 nm), and $MoO_x/DyO_x$ (1 nm)/SiON (2 nm). In some embodiments, a metal barrier layer of TiN or TaN may be implemented for capping purposes.

The method 100 continues with block 150 in which a first gate stack is formed over the first region and a second gate stack is formed over the second region. In a gate first process, the semiconductor device 200 may further include a polysilicon (or poly) layer formed over the Mo layer 220 by a suitable deposition process. The poly layer may include a thickness ranging from about 400 to about 800 angstrom (Å). The semiconductor device 200 may optionally include a hard mask layer, such as silicon nitride or silicon oxynitride, formed on the poly layer. The hard mask layer may include a thickness ranging from about 100 to about 400 angstrom (Å).

A patterned photoresist layer may be formed on the hard mask layer including a gate pattern overlying the nMOS region 206 and a gate pattern overlying the pMOS region 208. The gate patterns may be used to pattern the hard mask layer by a dry or wet etch process. The patterned hard mask may then be used to form a gate stack in the nMOS region 206 and a gate stack in the pMOS region 208 by a dry etch process, wet etch process, or combination dry and wet etch process. It is understood the semiconductor device 200 may continue with a CMOS process flow to form various structures and features such as lightly doped source/drain regions (LDD), sidewall spacers on the gate stacks, source/drain regions, silicide features, contact etch stop layers (CESL), inter-level dielectric (ILD), contact/vias, interconnect layers, metal layers, dielectric layers, passivation layer and so forth.

It should be noted that the dual high-k dielectric and single metal gate structure of the nMOS and pMOS transistors may be formed in a gate last or gate replacement process instead of a gate first process discussed above. In a gate last process, the gate stacks are initially formed with dummy gates and continues with processing until deposition of the ILD layer. A chemical mechanical polishing is performed on the ILD layer until the dummy gates are exposed. The dummy gates are then removed and replaced with metal gates.

Referring to FIG. 3, illustrated is a flowchart of an alternative method 300 for fabricating a semiconductor device having dual high-k dielectric and single metal gate according to various aspects of the present disclosure. Referring also to FIGS. 4A to 4D, illustrated are cross-sectional views of a semiconductor device 400 at various stages of fabrication according to the method 300 of FIG. 3. FIGS. 4A to 4D have been simplified to emphasize gate structures of an nMOS device and pMOS device, respectively, for a better understanding of the inventive concepts of the present embodiment.

The semiconductor device 400 may be similar to the semiconductor device 200 of FIG. 2. Similar features in FIGS. 2 and 4 are numbered the same for the sake of simplicity and clarity.

The method 300 begins with block 310 in which a semiconductor substrate having a first region and a second region is provided. In FIG. 4A, the semiconductor device 400 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 400 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an nMOS transistor device and the active region 208 may be configured as a pMOS transistor device.

The method 300 continues with block 320 in which an interfacial layer is formed over the first and second regions of the substrate. The semiconductor device 400 further includes an interfacial layer 210 formed on the substrate 202. The interfacial layer 210 may include a silicon oxide layer having a thickness less than 2 nm. Alternatively, the interfacial layer 210 optionally includes silicon oxynitride (SiON) having a thickness less than 2 nm. The interfacial layer 210 may be formed by ALD, CVD, PVD, or other suitable technique.

The method 300 continues with block 330 in which a $DyO_x$ layer is formed over the interfacial layer. A $DyO_x$ layer 412 is formed over the interfacial layer 210. The $DyO_x$ layer 412 may be formed by ALD, CVD, PVD, or other suitable technique. The $DyO_x$ layer 412 may include a thickness less than 3 nm. In the present embodiment, the $DyO_x$ layer 412 has a thickness of about 2 nm. Additionally, an annealing process may be performed at this stage or later to cause intermixing of the interfacial layer 210 and the $DyO_x$ layer 412 which helps in adjusting a work function for a properly performing nMOS transistor device.

The method 300 continues with block 340 in which an $AlO_x$ layer is formed over the $DyO_x$ layer. The semiconductor device 400 further includes an $AlO_x$ layer 414 formed over the $DyO_x$ layer 412. The $AlO_x$ layer 414 may be formed by ALD, CVD, PVD, or other suitable technique. The $AlO_x$ layer 414 may include a thickness less than 3 nm. In the present embodiment, the $AlO_x$ layer 414 has a thickness of about 2 nm.

Figure 4D:
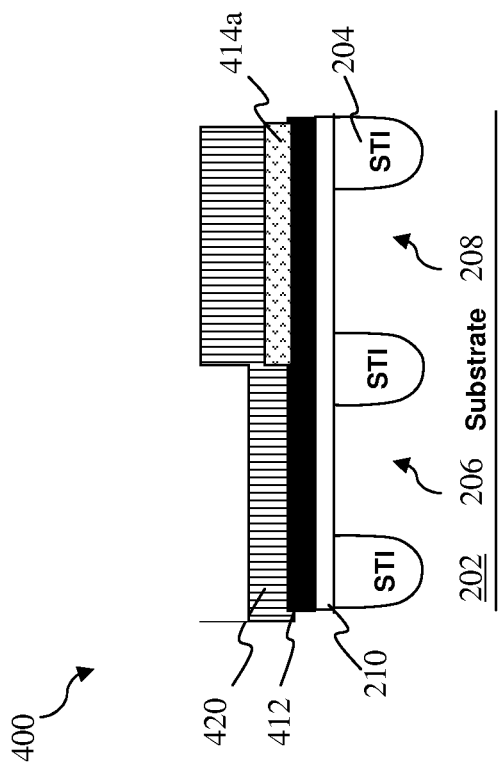
Figure 4C:
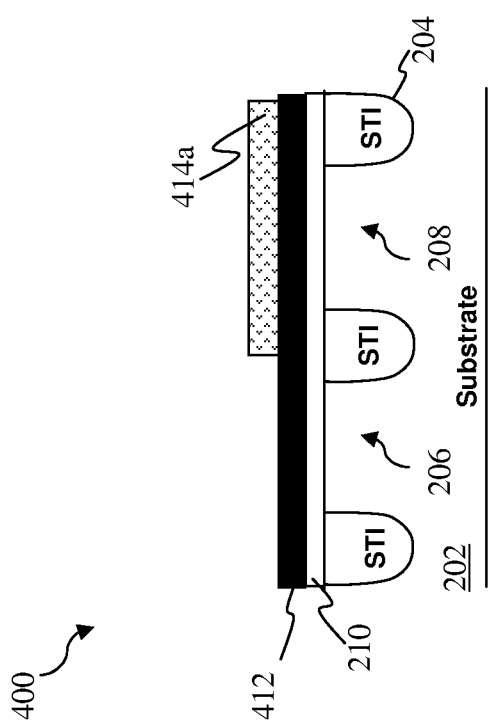

The method 300 continues with block 350 in which a portion of the $AlO_x$ layer overlying the first region of the substrate is removed. In FIG. 4B, the $AlO_x$ layer 414 may be patterned by a photolithography process and etching process to remove the $AlO_x$ layer 414 in the nMOS region 206. A patterned photoresist 416 may be formed on a portion of the $AlO_x$ layer 414, and an etching process may be performed to remove the unprotected AlO$_x$ layer 414. In FIG. 4C, an AlO$_x$ layer 414a remains in the pMOS region 208. The photoresist 416 may be removed by a stripping process or other suitable process.

The method 300 continues with block 360 in which a Mo layer is formed over the DyO$_x$ layer of the first region and over the AlO$_x$ layer of the second region. In FIG. 4D, the semiconductor device 400 further includes a Mo layer 420 formed over the DyO$_x$ layer 412 and the AlO$_x$ layer 414a. The Mo layer 420 may have a thickness ranging from 20 to about 200 angstrom (Å). The Mo layer 420 may be formed by various deposition techniques such as CVD, PVD or sputtering, plating, or other suitable technique. In other embodiment, a W layer may be utilized instead of the Mo layer. Further, an annealing process may be performed at this stage to cause some intermixing of the interfacial layer with the DyO$_x$ layer to help in adjusting the work function of the nMOS transistor. It is understood that the annealing may be performed in a subsequent process in the CMOS technology process flow instead of being performed at this stage in the fabrication process. Additionally, it is noted that an interaction of the Mo layer 420 and the AlO$_x$ layer 414a establishes a voltage flat band near p-type for the pMOS transistor.

In some embodiments, the Mo layer 420 may be incorporated with O, N, or Si. For example, it has been observed that various configurations (e.g., composition and thickness) may be used to adjust the work function in the nMOS transistor device. For example, the various configurations include MoON/DyO$_x$ (1 nm)/SiON (1.5 nm), MoON/DyO$_x$ (2 nm)/SiON (1.5 nm), MoON/DyO$_x$ (1 nm)/SiON (2 nm), MoON/DyO$_x$ (2 nm)/SiON (2 nm), MoO$_x$/DyO$_x$ (1 nm)/SiON (1.5 nm), MoO$_x$/DyO$_x$ (2 nm)/SiON (1.5 nm), MoO$_x$/DyO$_x$ (1 nm)/SiON (2 nm), and MoO$_x$/DyO$_x$ (1 nm)/SiON (2 nm). In some embodiments, a metal barrier layer of TiN or TaN may be implemented for capping purposes.

The method 300 continues with block 370 in which a first gate stack may be formed in a first region and a second gate stack may be formed in the second region. The process implemented for block 370 is similar to the process discussed in block 150 of FIG. 1. Thereafter, it is understood the semiconductor device 400 may continue with CMOS process flow to form various structures such as lightly doped drain regions (LDD), sidewall spacers on the gate stacks, source/drain regions, silicide features, contact etch stop layers (CESL), inter-level dielectric (ILD), contact/vias, interconnect layers, metal layers, dielectric layers, passivation layer and so forth. Further, it should be noted that the dual high-k dielectric and single metal gate structure of the nMOS and pMOS transistors may be formed in a gate last or gate replacement process instead of a gate first process discussed above.

Figure 6D:
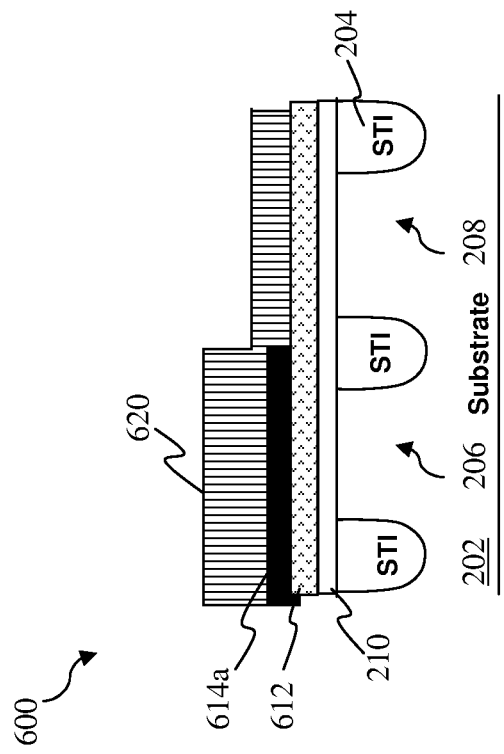
Figure 6C:
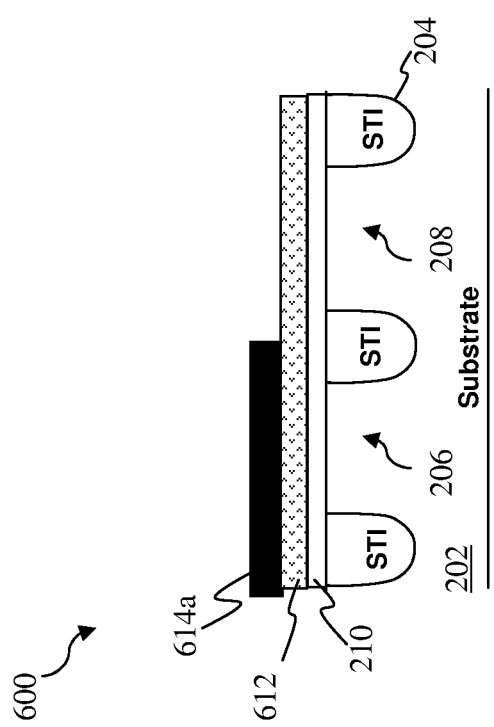

Referring to FIG. 5, illustrated is a flowchart of an alternative method 500 for fabricating a semiconductor device having dual high-k dielectric and single metal gate according to various aspects of the present disclosure. Referring also to FIGS. 6A to 6D, illustrated are cross-sectional views of a semiconductor device 600 at various stages of fabrication according to the method 500 of FIG. 5. FIGS. 6A to 6D have been simplified to emphasize gate structures of an nMOS device and pMOS device, respectively, for a better understanding of the inventive concepts of the present embodiment. The semiconductor device 600 may be similar to the semiconductor device 200 of FIG. 2. Similar features in FIGS. 2 and 6 are numbered the same for the sake of simplicity and clarity.

The method 500 begins with block 510 in which a semiconductor substrate having a first region and a second region is provided. In FIG. 6A, the semiconductor device 600 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 600 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an nMOS transistor device and the active region 208 may be configured as a pMOS transistor device.

The method 500 continues with block 520 in which an interfacial layer is formed over the first and second regions of the substrate. The semiconductor device 600 further includes an interfacial layer 210 formed on the substrate 202. The interfacial layer 210 may include a silicon oxide layer having a thickness less than 2 nm. Alternatively, the interfacial layer 210 optionally includes silicon oxynitride (SiON) having a thickness less than 2 nm. The interfacial layer 210 may be formed by ALD, CVD, PVD, or other suitable technique.

The method 500 continues with block 530 in which an AlO$_x$ layer is formed over the interfacial layer. An AlO$_x$ layer 612 is formed over the interfacial layer 210. The AlO$_x$ layer 612 may be formed by ALD, CVD, PVD, or other suitable technique. The AlO$_x$ layer 612 may include a thickness less than 3 nm. In the present embodiment, the AlO$_x$ layer 612 has a thickness of about 2 nm. Additionally, an annealing process may be performed at this stage or later to cause intermixing of the interfacial layer 210 and the AlO$_x$ layer 612 which helps in adjusting a work function for a properly performing pMOS transistor device.

The method 500 continues with block 540 in which a DyO$_x$ layer is formed over the AlO$_x$ layer. The semiconductor device 600 further includes a DyO$_x$ layer 614 formed over the AlO$_x$ layer 612. The DyO$_x$ layer 614 may be formed by ALD, CVD, PVD, or other suitable technique. The DyO$_x$ layer 614 may include a thickness less than 3 nm. In the present embodiment, the DyO$_x$ layer 614 has a thickness of about 2 nm.

The method 500 continues with block 550 in which a portion of the DyO$_x$ layer overlying the second region of the substrate is removed. In FIG. 6B, the DyO$_x$ layer 614 may be patterned by a photolithography process and etching process to remove the DyO$_x$ layer 614 in the pMOS region 208. A patterned photoresist 616 may be formed on a portion of the DyO$_x$ layer 614, and an etching process may be performed to remove the unprotected DyO$_x$ layer 614. In FIG. 6C, a DyO$_x$ layer 614a remains in the nMOS region 206. The photoresist 616 may be removed by a stripping process or other suitable process.

The method 500 continues with block 560 in which a Mo layer is formed over the DyO$_x$ layer of the first region and over the AlO$_x$ layer of the second region. In FIG. 6D, the semiconductor device 600 further includes a Mo layer 620 formed over the DyO$_x$ layer 614a and the AlO$_x$ layer 612. The Mo layer 620 may have a thickness ranging from 20 to about 200 angstrom (Å). The Mo layer 620 may be formed by various deposition techniques such as CVD, PVD or sputtering, plating, or other suitable technique. In other embodiment, a W layer may be utilized instead of the Mo layer. Further, an annealing process may be performed at this stage to cause some intermixing of the interfacial layer with the AlO$_x$ layer to help in adjusting the work function of the pMOS transistor. It is understood that the annealing may be performed in a subsequent process in the CMOS technology process flow instead of being performed at this stage in the fabrication process. Additionally, it is noted that an interaction of the Mo layer 620 and the DyO$_x$ layer 614a shifts a voltage flat band towards n-type for the nMOS transistor.

In some embodiments, the Mo layer 620 may be incorporated with O, N, or Si. For example, it has been observed that various configurations (e.g., composition and thickness) may be used to adjust the work function in the nMOS transistor device. For example, the various configurations include MoON/DyO$_x$ (1 nm)/SiON (1.5 nm), MoON/DyO$_x$ (2 nm)/SiON (1.5 nm), MoON/DyO$_x$ (1 nm)/SiON (2 nm), MoON/DyO$_x$ (2 nm)/SiON (2 nm), MoO$_x$/DyO$_x$ (1 nm)/SiON (1.5 nm), MoO$_x$/DyO$_x$ (2 nm)/SiON (1.5 nm), MoO$_x$/DyO$_x$ (1 nm)/SiON (2 nm), and MoO$_x$/DyO$_x$ (1 nm)/SiON (2 nm). In some embodiments, a metal barrier layer of TiN or TaN may be implemented for capping purposes.

The method 500 continues with block 570 in which a first gate stack may be formed in a first region and a second gate stack may be formed in the second region. The process implemented for block 570 is similar to the process discussed in block 150 of FIG. 1. Thereafter, it is understood the semiconductor device 600 may continue with CMOS process flow to form various structures such as lightly doped drain regions (LDD), sidewall spacers on the gate stacks, source/drain regions, silicide features, contact etch stop layers (CESL), inter-level dielectric (ILD), contact/vias, interconnect layers, metal layers, dielectric layers, passivation layer and so forth. Further, it is noted that the dual high-k dielectric and single metal gate structure of the nMOS and pMOS transistors may be formed in a gate last or gate replacement process instead of a gate first process discussed above.

Figure 7:
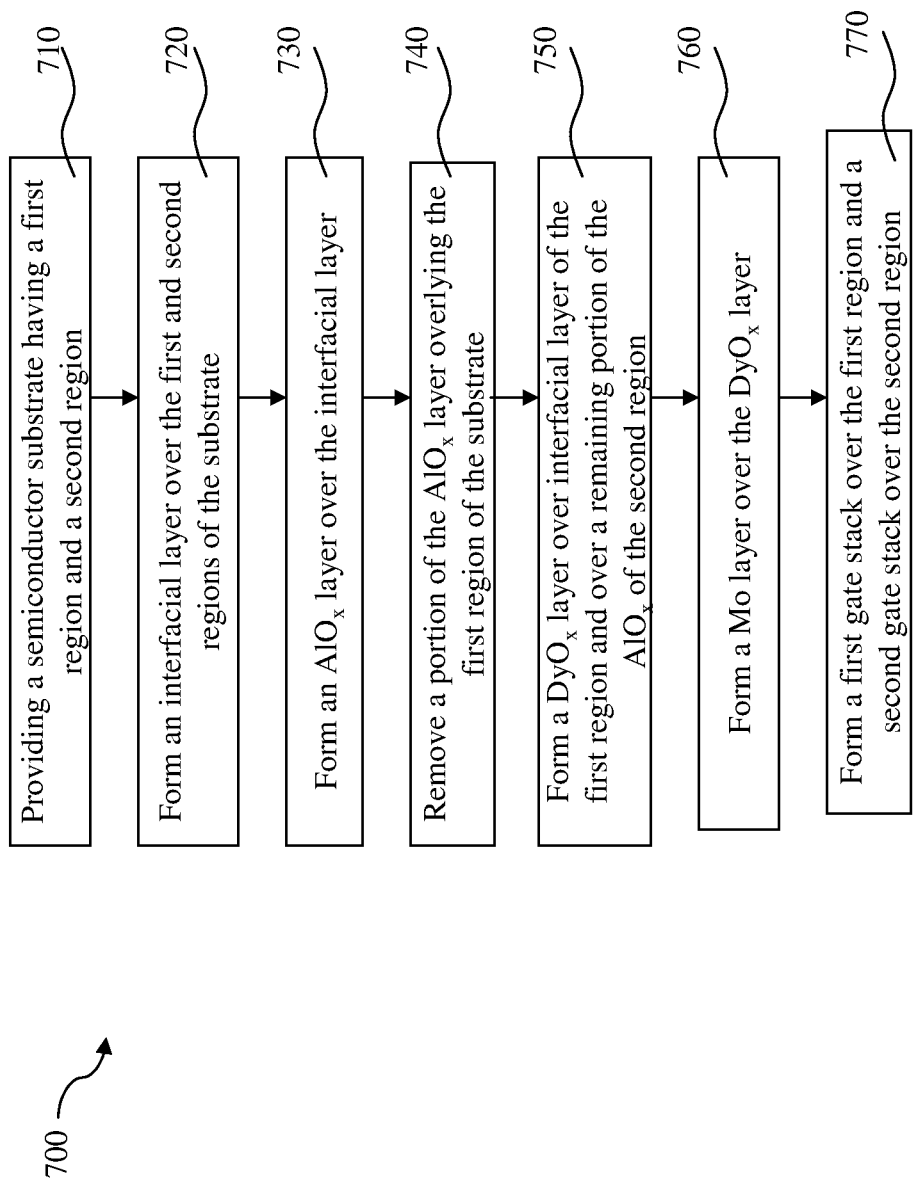
FIG. 7 is a flow chart illustrating still another method of fabricating a semiconductor device in a high-k/metal gate process according to various aspects of the present disclosure.
Figure 8D:
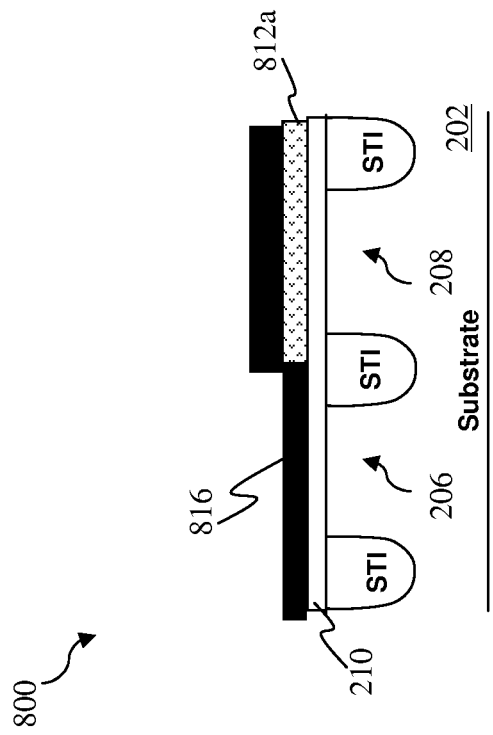
Figure 8C:
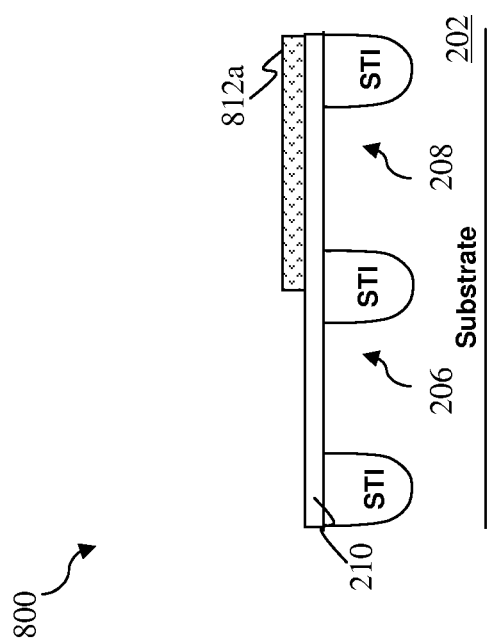
Figure 8E:
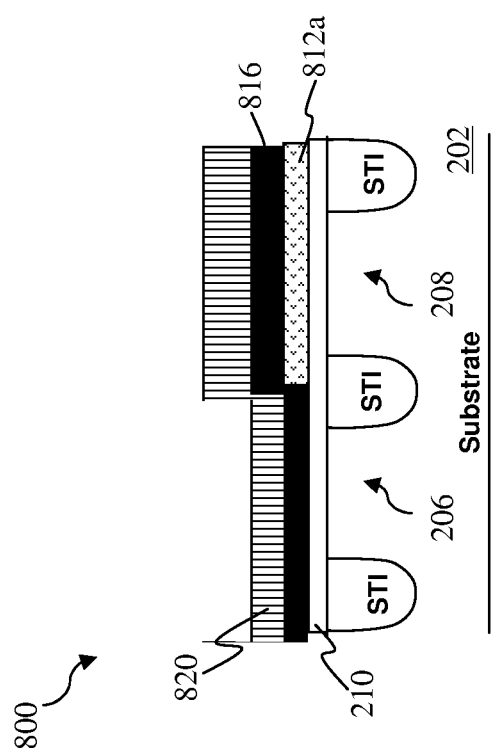

Referring to FIG. 7, illustrated is a flowchart of an alternative method 700 for fabricating a semiconductor device having dual high-k dielectric and single metal gate according to various aspects of the present disclosure. Referring also to FIGS. 8A to 8E, illustrated are cross-sectional views of a semiconductor device 600 at various stages of fabrication according to the method 700 of FIG. 7. FIGS. 8A to 8E have been simplified to emphasize gate structures of an nMOS device and pMOS device, respectively, for a better understanding of the inventive concepts of the present embodiment. The semiconductor device 800 may be similar to the semiconductor device 200 of FIG. 2. Similar features in FIGS. 2 and 8 are numbered the same for the sake of simplicity and clarity.

The method 700 begins with block 710 in which a semiconductor substrate having a first region and a second region is provided. In FIG. 8A, the semiconductor device 800 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 800 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an nMOS transistor device and the active region 208 may be configured as a pMOS transistor device.

The method 700 continues with block 720 in which an interfacial layer is formed over the first and second regions of the substrate. The semiconductor device 800 further includes an interfacial layer 210 formed on the substrate 202. The interfacial layer 210 may include a silicon oxide layer having a thickness less than 2 nm. Alternatively, the interfacial layer 210 optionally includes silicon oxynitride (SiON) having a thickness less than 2 nm. The interfacial layer 210 may be formed by ALD, CVD, PVD, or other suitable technique.

The method 700 continues with block 730 in which an AlO$_x$ layer is formed over the interfacial layer. An AlO$_x$ layer 812 is formed over the interfacial layer 210. The AlO$_x$ layer 812 may be formed by ALD, CVD, PVD, or other suitable technique. The AlO$_x$ layer 812 may include a thickness less than 3 nm. In the present embodiment, the AlO$_x$ layer 812 has a thickness of about 2 nm.

The method 700 continues with block 740 in which a portion of the AlO$_x$ layer overlying the first region of the substrate is removed. In FIG. 8B, the AlO$_x$ layer 812 may be patterned by a photolithography process and etching process to remove the AlO$_x$ layer 812 in the nMOS region 206. A patterned photoresist 814 may be formed on a portion of the AlO$_x$ layer 812, and an etching process may be performed to remove the unprotected AlO$_x$ layer 812. In FIG. 8C, an AlO$_x$ layer 812a remains in the pMOS region 208. The photoresist 814 may be removed by a stripping process or other suitable process. Additionally, an annealing process may be performed at this stage or later to cause intermixing of the interfacial layer 210 and the AlO$_x$ layer 812 which helps in adjusting a work function for a properly performing pMOS transistor device.

The method 700 continues with block 750 in which a DyO$_x$ layer is formed over the interfacial layer of the first region and a remaining AlO$_x$ layer of the second region. In FIG. 8D, the semiconductor device 800 further includes a DyO$_x$ layer 816 formed over the interfacial layer 210 in the nMOS region 206 and over the AlO$_x$ layer 812a in the pMOS region 208. The DyO$_x$ layer 816 may be formed by ALD, CVD, PVD, or other suitable technique. The DyO$_x$ layer 816 may include a thickness less than 3 nm. In the present embodiment, the DyO$_x$ layer 816 has a thickness of about 2 nm. Additionally, an annealing process may be performed at this stage or later to cause intermixing of the interfacial layer 210 and the DyO$_x$ layer 816 which helps in adjusting a work function for a properly performing nMOS transistor device.

The method 700 continues with block 760 in which a Mo layer is formed over the DyO$_x$ layer. In FIG. 8E, the semiconductor device 800 further includes a Mo layer 820 formed over the DyO$_x$ layer 816. The Mo layer 820 may have a thickness ranging from 20 to about 200 angstrom (Å). The Mo layer 820 may be formed by various deposition techniques such as CVD, PVD or sputtering, plating, or other suitable technique. In other embodiment, a W layer may be utilized instead of the Mo layer. Further, an annealing process may be performed at this stage to cause some intermixing of the interfacial layer with the $DyO_x$ and with the $AlO_x$ layer to help in adjusting the work function of the respective transistor devices. It has been observed that the interaction of the $DyO_x$ layer and the Mo layer causes a voltage flat band shift towards n-type for the nMOS transistor.

In some embodiments, the Mo layer 820 may be incorporated with O, N, or Si. For example, it has been observed that various configurations (e.g., composition and thickness) may be used to adjust the work function in the nMOS transistor device. For example, the various configurations include $MoON/DyO_x$ (1 nm)/SiON (1.5 nm), $MoON/DyO_x$ (2 nm)/SiON (1.5 nm), $MoON/DyO_x$ (1 nm)/SiON (2 nm), $MoON/DyO_x$ (2 nm)/SiON (2 nm), $MoO_x/DyO_x$ (1 nm)/SiON (1.5 nm), $MoO_x/DyO_x$ (2 nm)/SiON (1.5 nm), $MoO_x/DyO_x$ (1 nm)/SiON (2 nm), and $MoO_x/DyO_x$ (1 nm)/SiON (2 nm). In some embodiments, a metal barrier layer of TiN or TaN may be implemented for capping purposes.

The method 700 continues with block 770 in which a first gate stack may be formed in a first region and a second gate stack may be formed in the second region. The process implemented for block 770 is similar to the process discussed in block 150 of FIG. 1. Thereafter, it is understood the semiconductor device 800 may continue with CMOS process flow to form various structures such as lightly doped drain regions (LDD), sidewall spacers on the gate stacks, source/drain regions, silicide features, contact etch stop layers (CESL), inter-level dielectric (ILD), contact/vias, interconnect layers, metal layers, dielectric layers, passivation layer and so forth. Further, it is noted that the dual high-k dielectric and single metal gate structure of the nMOS and pMOS transistors may be formed in a gate last or gate replacement process instead of a gate first process discussed above. In addition, it is understood that the $AlO_x$ layer may be deposited over both nMOS and pMOS regions in the final device instead of the $DyO_x$ layer. Additionally, it is noted that the $DyO_x$ should minimally mix with the $AlO_x$ and interfacial layers in the pMOS region, and thus the $AlO_x$ layer functions as a blocking layer. Moreover, it is noted that the $DyO_x$ layer 816 in the pMOS region 208 is sufficiently thin so as not to adversely effect the work function of the pMOS transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, other rare earth elements (e.g., La, Yb, Er, etc.) may be implemented in combination with aluminum oxide to achieve the proper work functions of nMOS and pMOS transistors. Further, the $DyO_x$ and $AlO_x$ dielectric layers are relatively thin and are dependent on a thickness of the interfacial layer to achieve the desired equivalent oxide thickness (EOT) of design requirements. Additionally, for intermixing of the interfacial layer and metal oxide (e.g., $DyO_x$ and $AlO_x$), a thickness of the metal oxide and the interfacial layer are correlated to a silicate composition ($M_xSi_yO_z$).

What is claimed is:

1. A semiconductor device, comprising:
   a semiconductor substrate having a first region and a second region;
   a pMOS transistor formed over the first region, the pMOS transistor having a gate structure that includes:
     an interfacial layer formed over the substrate;
     a rare earth metal oxide layer thrilled over and directly contacting the interfacial layer;
     a $AlO_x$ layer formed over and directly contacting the rare earth metal oxide layer; and
     a metal layer including one of Mo and W formed over the $AlO_x$ layer; and
   an nMOS transistor formed over the second region, the nMOS transistor having a gate structure that includes:
     the interfacial layer formed over the substrate;
     the rare earth metal oxide layer formed over the interfacial layer; and
     the metal layer including the one of Mo and W formed over the rare earth metal oxide layer.

2. The semiconductor device of claim 1, wherein the rare earth metal oxide includes $DyO_x$.

3. The semiconductor device of claim 1, wherein the interfacial layer includes one of silicon oxide and silicon oxynitride, and the interfacial layer has a thickness less than about 2 nm.

4. The semiconductor device of claim 2, wherein the interfacial layer is intermixed with the $AlO_x$ layer and with the $DyO_x$ layer.

5. The semiconductor device of claim 1, wherein the $AlO_x$ layer includes a thickness less than about 3 nm.

6. The semiconductor device of claim 2, wherein the $DyO_x$ layer includes a thickness less than about 3 nm.

7. The semiconductor device of claim 1, wherein Mo layer is incorporated with one of O, N, Si combinations thereof.

8. The semiconductor device of claim 1, wherein the rare earth metal oxide includes one of $LaO_x$, $YbO_x$, and $ErO_x$.

9. A method of fabricating a semiconductor device, comprising:
   providing a semiconductor substrate having a first region and a second region, wherein the first region is a nMOS region and the second region is a pMOS region;
   forming an interfacial layer over the first and second regions of the semiconductor substrate;
   forming a $DyO_x$ layer over and directly contacting the interfacial layer of the first region and the second region;
   forming a $AlO_x$ layer over and directly contacting the $DyO_x$ luer in the second region;
   performing an annealing thereby causing intermixing of the interfacial layer with the $DyO_x$ layer;
   forming a metal layer of Mo or W over the $DyO_x$ layer and over the $AlO_x$ layer in the second region;
   forming a TiN or TaN cap over the metal layer; and
   filming a first gate stack over the first region and a second gate stack over the second region, wherein the second gate stack over the PMOS region includes the $DyO_x$ layer the $AlO_x$ layer.

10. The method of claim 9, wherein the interfacial includes one of silicon oxide and silicon oxynitride.

11. The method of claim 10, wherein the interfacial layer includes a thickness less than about 2 nm.

12. The method of claim 9, wherein the $DyO_x$ layer and the $AlO_x$ layer each includes a thickness less than about 3 nm.

13. The method of claim 9, wherein the first gate stack is part of an nMOS transistor and the second gate stack is pan of a pMOS transistor.

14. The method of claim 9, further comprising incorporating one of O, N, Si, and combinations thereof in the Mo layer.

15. A semiconductor device, comprising:
a semiconductor substrate having a first region and a second region;
a pMOS transistor disposed over the first region, the pMOS transistor having a gate structure that includes:
an interfacial layer disposed over the substrate, the interfacial layer including one of silicon oxide and silicon oxynitride;
a $DyO_x$ layer disposed over and directly contacting the interfacial layer;
an $AlO_x$ layer disposed over the $DyO_x$ layer; and
a Mo layer disposed over the $AlO_x$ layer, the Mo layer being incorporated with one of O, N, and Si;
an nMOS transistor formed over the second region, the nMOS transistor having a gate structure that includes:
the interfacial layer disposed over the substrate;
the $DyO_x$ layer formed over the interfacial layer; and
the Mo layer disposed over the $DyO_x$ layer.

16. The semiconductor device of claim 15, wherein the gate structure of the nMOS and pMOS transistors further include a TiN or TaN metal capping layer over the Mo layer.

17. The semiconductor device of claim 15, wherein the interfacial layer includes one of silicon oxide and silicon oxynitride.

18. The semiconductor device of claim 15, wherein the $DyO_x$ layer and the $AlO_x$ layer each includes a thickness less than about 3 nm.

19. The method of claim 9, further comprising removing the $AlO_x$ layer on the $DyO_x$ layer over the interfacial layer of the first region to expose a portion of the $DyO_x$ layer in the first region.

20. The method of claim 19, wherein forming the metal layer of Mo or W over the $DyO_x$ layer and over the $AlO_x$ layer includes forming the metal layer of Mo or W directly on the exposed portion of the $DyO_x$ layer in the first region such that the metal layer of Mo or W physically contacts the exposed portion of the $DyO_x$ layer in the first region.

* * * * *